United States Patent
Bleeker et al.

(10) Patent No.: US 9,513,561 B2
(45) Date of Patent: Dec. 6, 2016

(54) LITHOGRAPHIC APPARATUS, METHOD FOR MAINTAINING A LITHOGRAPHIC APPARATUS AND DEVICE MANUFACTURING METHOD

(75) Inventors: Arno Jan Bleeker, Westerhoven (NL); Martinus Hendricus Henricus Hoeks, Breugel (NL); Theodorus Petrus Maria Cadee, Vlierden (NL)

(73) Assignee: ASML NETHERLANDS B.V., Veldhoven (NL)

( * ) Notice: Subject to any disclaimer, the term of this patent is extended or adjusted under 35 U.S.C. 154(b) by 425 days.

(21) Appl. No.: 14/006,934

(22) PCT Filed: Mar. 16, 2012

(86) PCT No.: PCT/EP2012/054736
§ 371 (c)(1),
(2), (4) Date: Sep. 23, 2013

(87) PCT Pub. No.: WO2012/143188
PCT Pub. Date: Oct. 26, 2012

(65) Prior Publication Data
US 2014/0009746 A1    Jan. 9, 2014

Related U.S. Application Data

(60) Provisional application No. 61/477,980, filed on Apr. 21, 2011.

(51) Int. Cl.
*G03B 27/42* (2006.01)
*G03F 7/20* (2006.01)

(52) U.S. Cl.
CPC ....... *G03F 7/70133* (2013.01); *G03F 7/70391* (2013.01); *G03F 7/70975* (2013.01)

(58) Field of Classification Search
CPC . G02B 26/123; G02B 5/1838; G03F 7/70775; G03F 7/70975; G03F 7/70141; G03F 7/2026; B41J 2/473; B41J 2/442; B41J 2/447; B41J 2/44; G03G 15/04036
See application file for complete search history.

(56) References Cited

U.S. PATENT DOCUMENTS

| 4,090,206 A | 5/1978 | Pfeifer |
| 4,447,126 A | 5/1984 | Heidrich |

(Continued)

FOREIGN PATENT DOCUMENTS

| CN | 1677237 | 10/2005 |
| CN | 101261452 | 9/2008 |

(Continued)

OTHER PUBLICATIONS

Japanese Office Action dated Nov. 4, 2014 in corresponding Japanese Patent Application No. 2014-505554.

(Continued)

*Primary Examiner* — Mesfin T Asfaw
(74) *Attorney, Agent, or Firm* — Pillsbury Winthrop Shaw Pittman LLP

(57) ABSTRACT

A lithographic apparatus having a plurality of individually controllable radiation source units each providing a portion of a patterned beam of radiation, a control system configured to monitor a parameter of performance of each of the individually controllable radiation source units, and a replacement mechanism configured to replace one of the individually controllable radiation source units with a replacement unit responsive to the control system determining that a criterion has been met based on the monitored parameter of performance.

20 Claims, 6 Drawing Sheets

(56) References Cited

U.S. PATENT DOCUMENTS

| | | | |
|---|---|---|---|
| 4,520,472 A | 5/1985 | Reno |
| 4,525,729 A | 6/1985 | Agulnek |
| 4,640,573 A | 2/1987 | Kataoka |
| 4,780,730 A | 10/1988 | Dodge |
| 4,796,038 A | 1/1989 | Allen |
| 4,844,568 A | 7/1989 | Suzuki |
| 4,864,216 A | 9/1989 | Kalata |
| 4,952,949 A | 8/1990 | Uebbing |
| 5,051,762 A | 9/1991 | Lea |
| 5,216,247 A | 6/1993 | Wang |
| 5,216,534 A | 6/1993 | Boardman |
| 5,229,872 A | 7/1993 | Mumola |
| 5,296,891 A | 3/1994 | Vogt |
| 5,343,271 A | 8/1994 | Morishige |
| 5,457,488 A | 10/1995 | Nakamura |
| 5,481,392 A | 1/1996 | Damer |
| 5,523,193 A | 6/1996 | Nelson |
| 5,568,320 A | 10/1996 | Rees |
| 5,589,973 A | 12/1996 | King |
| 5,610,754 A | 3/1997 | Gheen |
| 5,668,587 A | 9/1997 | Hammond |
| 5,705,788 A | 1/1998 | Beyer |
| 5,838,024 A | 11/1998 | Masuda |
| 5,840,451 A | 11/1998 | Moore |
| 6,037,965 A | 3/2000 | Gross |
| 6,133,986 A | 10/2000 | Johnson |
| 6,204,875 B1 | 3/2001 | De Loor |
| 6,268,613 B1 | 7/2001 | Cantu |
| 6,310,710 B1 | 10/2001 | Shahar |
| 6,313,862 B1 | 11/2001 | Berner |
| 6,466,352 B1 | 10/2002 | Shahar |
| 6,531,681 B1 | 3/2003 | Markle |
| 6,559,438 B1 | 5/2003 | Drobot |
| 6,683,727 B1 | 1/2004 | Goring |
| 6,765,647 B1 | 7/2004 | Nishi |
| 6,795,169 B2 | 9/2004 | Tanaka |
| 6,967,711 B2 | 11/2005 | Gui |
| 7,116,402 B2 | 10/2006 | Gui |
| 7,916,927 B2 | 3/2011 | Cramer et al. |
| 7,969,636 B2 | 6/2011 | Naito |
| 2002/0115021 A1 | 8/2002 | Piao |
| 2002/0126479 A1 | 9/2002 | Zhai |
| 2002/0171047 A1 | 11/2002 | Chan |
| 2003/0043582 A1 | 3/2003 | Chan |
| 2003/0091277 A1 | 5/2003 | Mei |
| 2004/0041087 A1 | 3/2004 | Saito et al. |
| 2004/0124372 A1 | 7/2004 | Gil |
| 2004/0135159 A1 | 7/2004 | Siegel |
| 2004/0257629 A1 | 12/2004 | Noehte |
| 2005/0167508 A1 | 8/2005 | Syms |
| 2005/0219496 A1 | 10/2005 | Oshida et al. |
| 2006/0001855 A1 | 1/2006 | Lof |
| 2006/0103719 A1 | 5/2006 | Katzir |
| 2006/0108508 A1 | 5/2006 | Khalid |
| 2007/0034890 A1 | 2/2007 | Daschner |
| 2007/0182808 A1 | 8/2007 | Stiblert |
| 2007/0296936 A1 | 12/2007 | Kato |
| 2008/0042969 A1 | 2/2008 | Baker |
| 2008/0047445 A1 | 2/2008 | Berner |
| 2008/0137051 A1 | 6/2008 | Maly |
| 2008/0160211 A1 | 7/2008 | Siegel |
| 2008/0170780 A1 | 7/2008 | Cramer et al. |
| 2008/0210888 A1 | 9/2008 | Inoue |
| 2009/0296063 A1 | 12/2009 | Opower |
| 2010/0142757 A1 | 6/2010 | Sandstrom |
| 2010/0265557 A1 | 10/2010 | Sallander |
| 2011/0051211 A1 | 3/2011 | Walther |
| 2011/0188016 A1 | 8/2011 | De Jager |
| 2012/0320359 A1 | 12/2012 | Van Zwet et al. |

FOREIGN PATENT DOCUMENTS

| | | |
|---|---|---|
| DE | 4315580 | 11/1994 |
| DE | 4315581 | 11/1994 |
| DE | 19813127 | 10/1998 |
| EP | 1 835 347 | 9/2007 |
| JP | 57-152273 | 9/1982 |
| JP | 63-123494 | 5/1988 |
| JP | 06-053105 | 2/1994 |
| JP | 06-275936 | 9/1994 |
| JP | 2003-195702 | 7/2003 |
| JP | 2003-220484 | 8/2003 |
| JP | 2005-316349 | 11/2005 |
| JP | 2006-173286 | 6/2006 |
| JP | 2006-278907 | 10/2006 |
| JP | 2009-220564 | 10/2009 |
| JP | 2010-217540 | 9/2010 |
| JP | 2010-276818 | 12/2010 |
| JP | 2011-043559 | 3/2011 |
| WO | 97/34171 | 9/1997 |
| WO | 98/33096 | 7/1998 |
| WO | 98/38597 | 9/1998 |
| WO | 2005/006082 | 1/2005 |
| WO | 2006/002668 | 1/2006 |
| WO | 2006/064363 | 6/2006 |
| WO | 2007/050022 | 5/2007 |
| WO | 2007/050023 | 5/2007 |
| WO | 2007/098935 | 9/2007 |
| WO | 2008/071347 | 6/2008 |
| WO | 2010/032224 | 3/2010 |
| WO | 2010/151123 | 12/2010 |
| WO | 2011/026610 | 3/2011 |
| WO | 2011/104171 | 9/2011 |

OTHER PUBLICATIONS

International Preliminary Report on Patentability and Written Opinion mailed Oct. 31, 2013 in corresponding International Patent Application No. PCT/EP2012/054736.

Korean Office Action dated Mar. 23, 2015 in corresponding Korean Patent Application No. 10-2013-7030447.

Japanese Office Action dated Apr. 7, 2015 in corresponding Japanese Patent Application No. 2014-505554.

Chinese Office Action dated Feb. 15, 2015 in corresponding Chinese Patent Application No. 201280019494.7.

LOT-Oriel Group Europe, "MicroWriter™ Laser Lithography System," www.LOT-Oriel.com (2 pp, date unknown, obtained Jul. 2010).

"Large-Plate Exposure System FX-63S," Nikon Web Magazine: Nikon Technology Outlook, Sep. 24, 2004, pp. 1-4.

JetScreen DX Flat Brochure (6 pp., date unknown, obtained Feb. 2009).

"Lithographic Apparatus and Device Manufacturing Method," Research Disclosure, Mason Publications, Hampshire, GB, vol. 551, No. 29. Mar. 1, 2010, p. 322, XP007139689, ISSN: 0374-4353.

International Search Report and Written Opinion mailed Aug. 23, 2012 in International Patent Application No. PCT/EP2012/054736.

Chinese Office Action dated Aug. 20, 2015 in corresponding Chinese Patent Application No. 201280019494.7.

LITHOGRAPHIC APPARATUS, METHOD FOR MAINTAINING A LITHOGRAPHIC APPARATUS AND DEVICE MANUFACTURING METHOD

CROSS-REFERENCE TO RELATED APPLICATIONS

This application is the U.S. national phase entry of PCT Patent Application No. PCT/EP2012/054736, which was filed on Mar. 16, 2012, which claims the benefit of priority of U.S. Provisional Application No. 61/477,980, which was filed on Apr. 21, 2011 and which is incorporated herein in its entirety by reference.

FIELD

The present invention relates to a lithographic apparatus, a method for maintaining a lithographic apparatus and a method for manufacturing a device.

BACKGROUND

A lithographic apparatus is a machine that applies a desired pattern onto a substrate or part of a substrate. A lithographic apparatus may be used, for example, in the manufacture of integrated circuits (ICs), flat panel displays and other devices or structures having fine features. In a conventional lithographic apparatus, a patterning device, which may be referred to as a mask or a reticle, may be used to generate a circuit pattern corresponding to an individual layer of the IC, flat panel display, or other device). This pattern may transferred on (part of) the substrate (e.g. silicon wafer or a glass plate), e.g. via imaging onto a layer of radiation-sensitive material (resist) provided on the substrate.

Instead of a circuit pattern, the patterning device may be used to generate other patterns, for example a color filter pattern, or a matrix of dots. Instead of a conventional mask, the patterning device may comprise a patterning array that comprises an array of individually controllable elements that generate the circuit or other applicable pattern. An advantage of such a "maskless" system compared to a conventional mask-based system is that the pattern can be provided and/or changed more quickly and for less cost.

Thus, a maskless system includes a programmable patterning device (e.g., a spatial light modulator, a contrast device, etc.). The programmable patterning device is programmed (e.g., electronically or optically) to form the desired patterned beam using the array of individually controllable elements. Types of programmable patterning devices include micro-mirror arrays, liquid crystal display (LCD) arrays, grating light valve arrays, arrays of self-emissive contrast devices and the like.

SUMMARY

In a lithographic apparatus in which a patterned beam of radiation is provided using a plurality of self-emissive contrast devices, for example arranged in an array, a relatively large number of self-emissive contrast devices may be used. In general, the greater the number of self-emissive contrast devices installed within the lithographic apparatus, the larger the area on a substrate on which a pattern may be projected at each instant. Accordingly, the greater the number of self-emissive contrast devices, the higher the throughput of the lithographic apparatus that may be expected.

However, self-emissive contrast devices, which may include a radiation source, may have a somewhat limited usable life. When a self-emissive contrast device ceases to operate properly, it may result in an error in the pattern formed on a substrate by the patterned beam of radiation. Accordingly, the operation of the lithographic apparatus is stopped, for example in order to replace the array of self-emissive contrast devices or an individual one of the self-emissive contrast devices.

This process may take a significant amount of time as an operator will need to gain access to the relevant part of the lithographic apparatus, remove the existing array of self-emissive contrast devices or an individual self-emissive contrast device, install the new array or new self-emissive contrast device, perform an alignment process in order to ensure that the array of self-emissive contrast devices or the individual self-emissive contrast device is properly aligned, reassemble any components removed in order to provide access to the array of self-emissive contrast devices and perform a calibration process before operation of the lithographic apparatus can be re-commenced.

The greater the number of self-emissive contrast devices within the lithographic apparatus, the greater the likelihood of any one of the self-emissive contrast devices failing, resulting in a desirably fast and efficient replacement operation to be performed.

Accordingly, there is presently a limit on the number of self-emissive contrast devices that may be efficiently utilized within a lithographic apparatus. In particular, although the nominal throughout of a lithographic apparatus may be increased by using a greater number of self-emissive contrast devices, as discussed above, in practice, the overall throughput of the lithographic apparatus may be reduced due to the time lost replacing self-emissive contrast devices that have failed.

It is therefore, for example, desirable to provide a lithographic apparatus utilizing self-emissive contrast devices in which the throughput of the apparatus may be increased, maintained or not significantly reduced.

According to an embodiment of the invention, there is provided a lithographic apparatus, configured to project a patterned beam of radiation onto a substrate comprising:
  a plurality of radiation source units, each comprising a radiation source configured to provide a portion of the patterned beam of radiation;
  a control system, configured to monitor at least one parameter of the performance of the radiation source units; and
  a replacement mechanism, configured to be operated in response to an instruction from the control system to replace at least one of the radiation source units with a replacement unit;
  wherein the control system is configured to control the replacement mechanism to replace at least one radiation source unit if a criterion is met based on the monitored parameter of performance of one of the radiation source units.

According to an embodiment of the invention, there is provided a method for maintaining a lithographic apparatus that comprises a plurality of radiation source units, each comprising a radiation source configured to provide a portion of a patterned beam of radiation to be projected onto a substrate, the method comprising:
  monitoring at least one parameter of the performance of the radiation source units; and replacing at least one of the radiation source units with a replacement unit based on the results of the monitoring using a replacement mechanism, wherein the replacement mechanism is operated to replace a radiation source unit if a criterion is met based on the monitored parameter of performance of one of the radiation source units.

According to an embodiment of the invention, there is provided a device manufacturing method, comprising:

using a lithographic apparatus to project a patterned beam of radiation onto successive substrates; and using a method described herein to maintain the lithographic apparatus during the use of the lithographic apparatus.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

An embodiment of the present invention relates to a lithographic apparatus that may include a programmable patterning device that may, for example, be comprised of an array of self-emissive contrast devices. Further information regarding such a lithographic apparatus may be found in PCT Patent Application Publication No. WO 2010/032224 A2, which is hereby incorporated by reference in its entirety.

Figure 1:
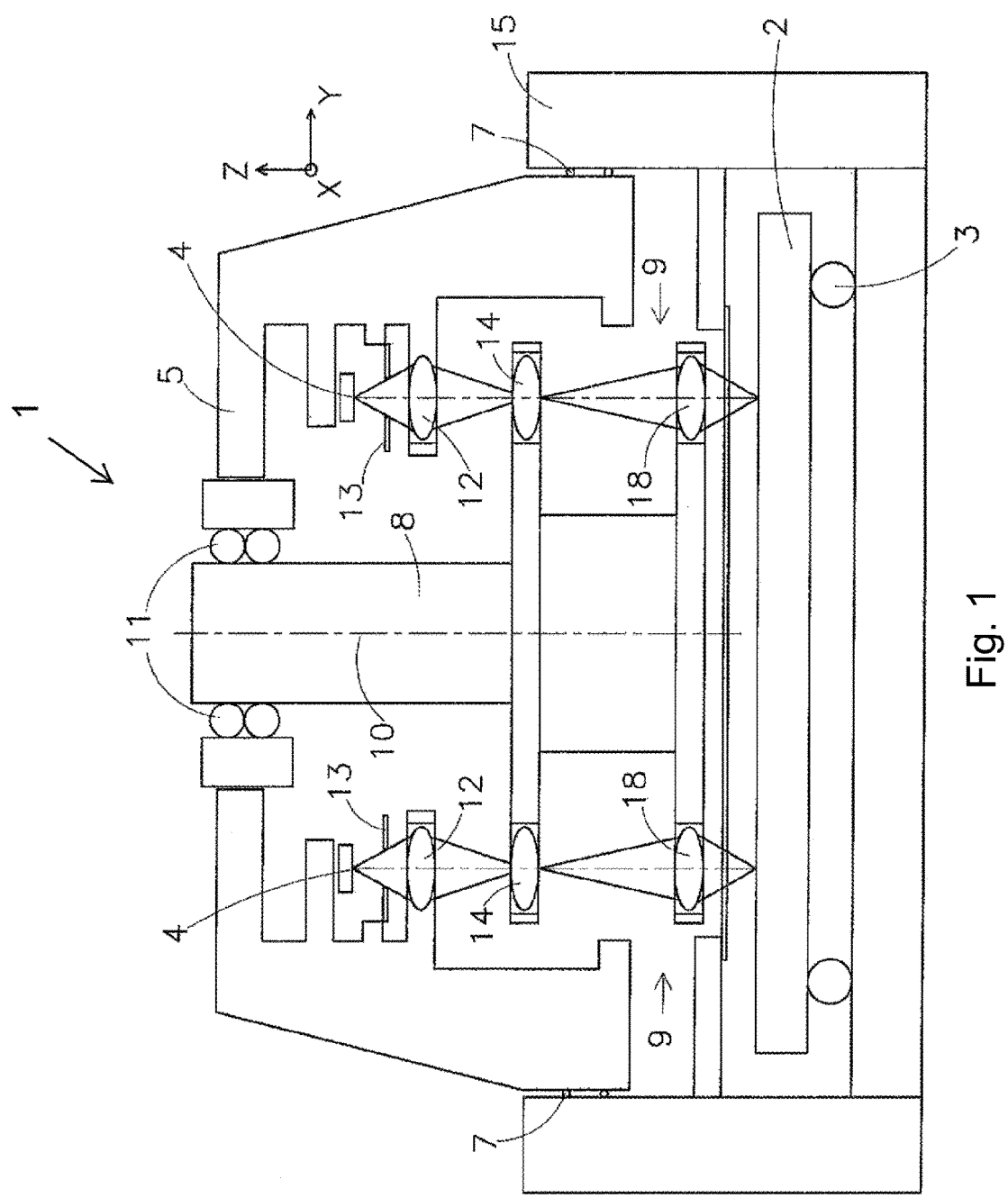
FIG. 1 depicts a part of a lithographic apparatus according to an embodiment of the invention.

FIG. 1 schematically depicts a schematic cross-sectional side view of a part of a lithographic apparatus. In this embodiment, the lithographic apparatus has individually controllable elements substantially stationary in the X-Y plane as discussed further below although it need not be the case. The lithographic apparatus 1 comprises a substrate table 2 to hold a substrate, and a positioning device 3 to move the substrate table 2 in up to 6 degrees of freedom. The substrate may be a resist-coated substrate. In an embodiment, the substrate is a wafer. In an embodiment, the substrate is a polygonal (e.g. rectangular) substrate. In an embodiment, the substrate is a glass plate. In an embodiment, the substrate is a plastic substrate. In an embodiment, the substrate is a foil. In an embodiment, the lithographic apparatus is suitable for roll-to-roll manufacturing.

The lithographic apparatus 1 further comprises a plurality of individually controllable self-emissive contrast devices 4 configured to emit a plurality of beams. In an embodiment, the self-emissive contrast device 4 is a radiation emitting diode, such as a light emitting diode (LED), an organic LED (OLED), a polymer LED (PLED), or a laser diode (e.g., a solid state laser diode). In an embodiment, each of the individually controllable elements 4 is a blue-violet laser diode (e.g., Sanyo model no. DL-3146-151). Such diodes may be supplied by companies such as Sanyo, Nichia, Osram, and Nitride. In an embodiment, the diode emits UV radiation, e.g., having a wavelength of about 365 nm or about 405 nm. In an embodiment, the diode can provide an output power selected from the range of 0.5-200 mW. In an embodiment, the size of laser diode (naked die) is selected from the range of 100-800 micrometers. In an embodiment, the laser diode has an emission area selected from the range of 0.5-5 micrometers$^2$. In an embodiment, the laser diode has a divergence angle selected from the range of 5-44 degrees. In an embodiment, the diodes have a configuration (e.g., emission area, divergence angle, output power, etc.) to provide a total brightness more than or equal to about $6.4 \times 10^8$ W/(m$^2 \cdot$sr).

Figure 2:
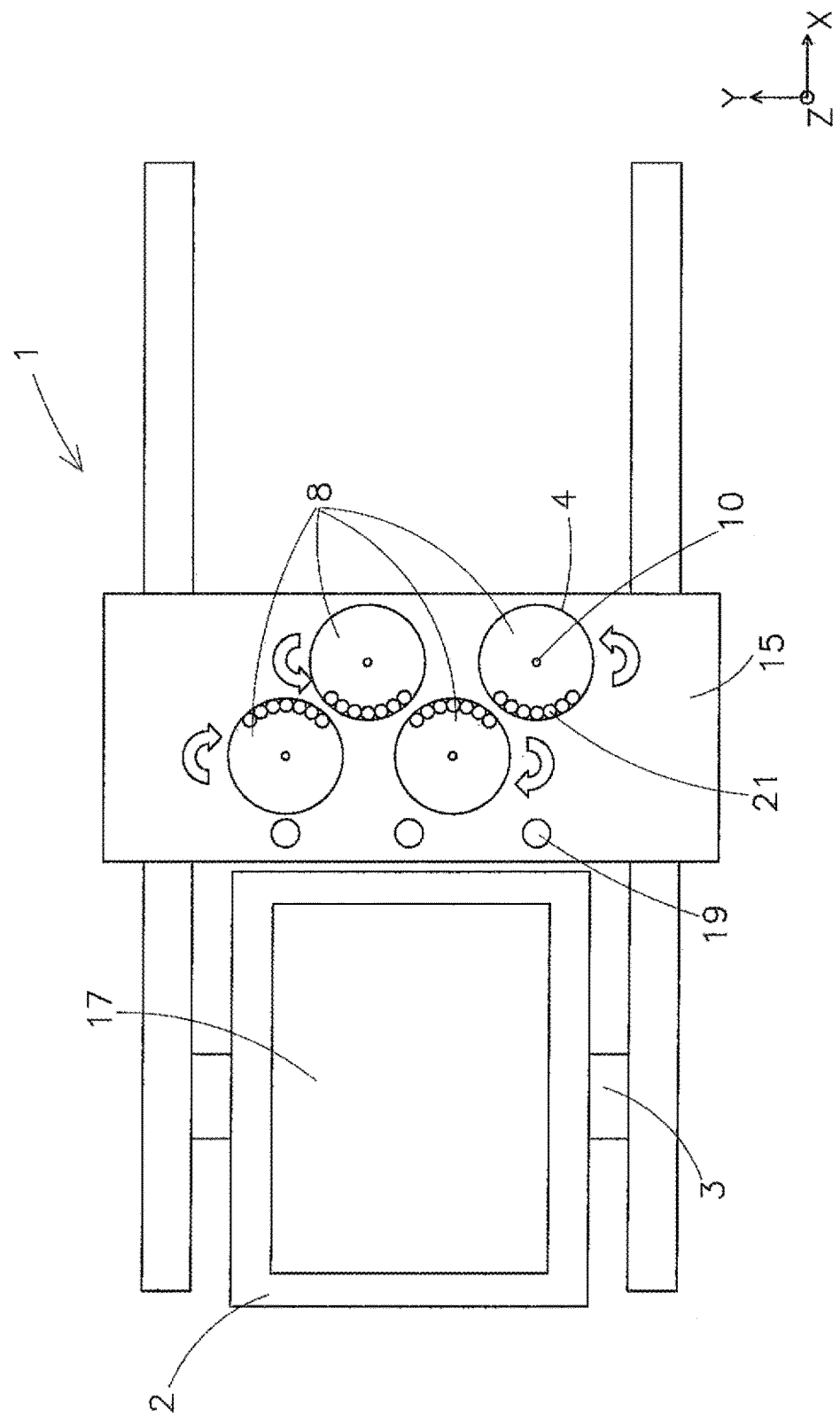
FIG. 2 depicts a top view of a part of the lithographic apparatus of FIG. 1 according to an embodiment of the invention.

The self-emissive contrast devices 4 are arranged on a frame 5 and may extend along the Y-direction and/or the X direction. While one frame 5 is shown, the lithographic apparatus may have a plurality of frames 5 as shown in FIG. 2. Further arranged on the frame 5 is lens 12. Frame 5 and thus self-emissive contrast device 4 and lens 12 are substantially stationary in the X-Y plane. Frame 5, self-emissive contrast device 4 and lens 12 may be moved in the Z-direction by actuator 7. Alternatively or additionally, lens 12 may be moved in the Z-direction by an actuator related to this particular lens. Optionally, each lens 12 may be provided with an actuator.

The self-emissive contrast device 4 may be configured to emit a beam and the projection system 12, 14 and 18 may be configured to project the beam onto a target portion of the substrate. The self-emissive contrast device 4 and the projection system form an optical column. The lithographic apparatus 1 may comprise an actuator (e.g. motor 11) to move the optical column or a part thereof with respect to the substrate. Frame 8 with arranged thereon field lens 14 and imaging lens 18 may be rotatable with the actuator. A combination of field lens 14 and imaging lens 18 forms movable optics 9. In use, the frame 8 rotates about its own axis 10, for example, in the directions shown by the arrows in FIG. 2. The frame 8 is rotated about the axis 10 using an actuator e.g. motor 11. Further, the frame 8 may be moved in a Z direction by motor 7 so that the movable optics 9 may be displaced relative to the substrate table 2.

An aperture structure 13 having an aperture therein may be located above lens 12 between the lens 12 and the self-emissive contrast device 4. The aperture structure 13 can limit diffraction effects of the lens 12, the associated self-emissive contrast device 4, and/or of an adjacent lens 12/self-emissive contrast device 4.

The depicted apparatus may be used by rotating the frame 8 and simultaneously moving the substrate on the substrate table 2 underneath the optical column. The self-emissive contrast device 4 can emit a beam through the lenses 12, 14, and 18 when the lenses are substantially aligned with each other. By moving the lenses 14 and 18, the image of the beam on the substrate is scanned over a portion of the substrate. By simultaneously moving the substrate on the substrate table 2 underneath the optical column, the portion of the substrate which is subjected to an image of the self-emissive contrast device 4 is also moving. By switching the self-emissive contrast device 4 "on" and "off" (e.g., having no output or output below a threshold when it is "off"

and having an output above a threshold when it is "on") at high speed under control of a controller, controlling the rotation of the optical column or part thereof, controlling the intensity of the self-emissive contrast device 4, and controlling the speed of the substrate, a desired pattern can be imaged in the resist layer on the substrate.

FIG. 2 depicts a schematic top view of the lithographic apparatus of FIG. 1 having self-emissive contrast devices 4. Like the lithographic apparatus 1 shown in FIG. 1, the lithographic apparatus 1 comprises a substrate table 2 to hold a substrate 17, a positioning device 3 to move the substrate table 2 in up to 6 degrees of freedom, an alignment/level sensor 19 to determine alignment between the self-emissive contrast device 4 and the substrate 17, and to determine whether the substrate 17 is at level with respect to the projection of the self-emissive contrast device 4. As depicted the substrate 17 has a rectangular shape, however also or alternatively round substrates may be processed.

The self-emissive contrast device 4 is arranged on a frame 15. The self-emissive contrast device 4 may be a radiation emitting diode, e.g., a laser diode, for instance a blue-violet laser diode. As shown in FIG. 2, the self-emissive contrast devices 4 may be arranged into an array 21 extending in the X-Y plane.

The array 21 may be an elongate line. In an embodiment, the array 21 may be a single dimensional array of self-emissive contrast devices 4. In an embodiment, the array 21 may be a two dimensional array of self-emissive contrast device 4.

A rotating frame 8 may be provided which may be rotating in a direction depicted by the arrow. The rotating frame may be provided with lenses 14, 18 (show in FIG. 1) to provide an image of each of the self-emissive contrast devices 4. The apparatus may be provided with an actuator to rotate the optical column comprising the frame 8 and the lenses 14, 18 with respect to the substrate.

Figure 3:
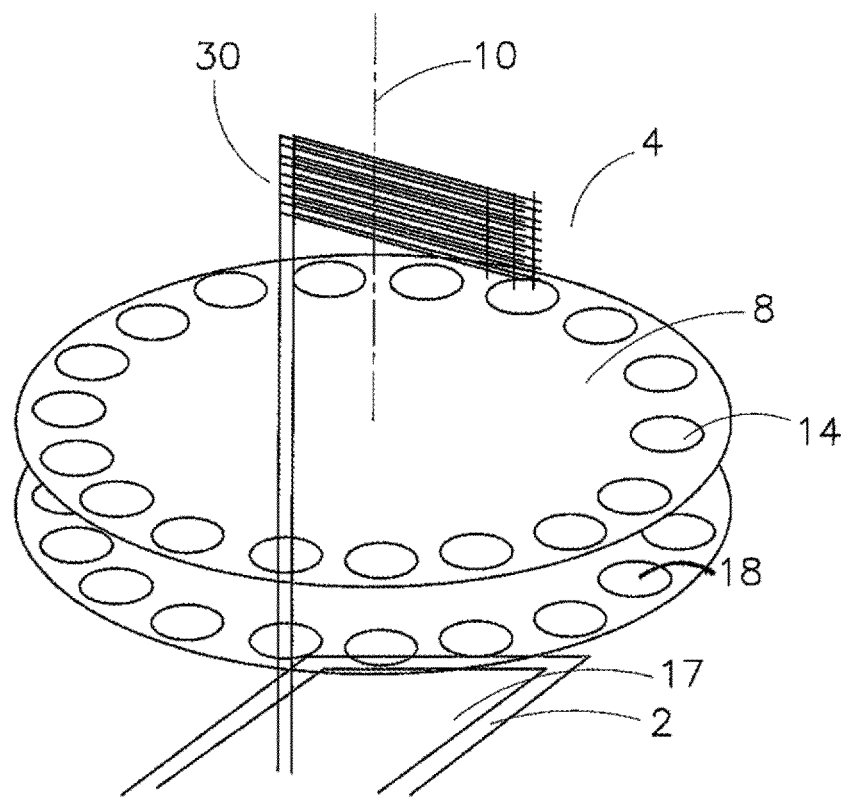
FIG. 3 depicts a highly schematic, perspective view of a part of a lithographic apparatus according to an embodiment of the invention.

FIG. 3 depicts a highly schematic, perspective view of the rotating frame 8 provided with lenses 14, 18 at its perimeter. A plurality of beams, in this example 10 beams, are incident onto one of the lenses and projected onto a target portion of the substrate 17 held by the substrate table 2. In an embodiment, the plurality of beams are arranged in a straight line. The rotatable frame is rotatable about axis 10 by means of an actuator (not shown). As a result of the rotation of the rotatable frame 8, the beams will be incident on successive lenses 14, 18 (field lens 14 and imaging lens 18) and will, incident on each successive lens, be deflected thereby so as to travel along a part of the surface of the substrate 17, as will be explained in more detail with reference to FIG. 4. In an embodiment, each beam is generated by a respective source, i.e. a self-emissive contrast device, e.g. a laser diode (not shown in FIG. 3). In the arrangement depicted in FIG. 3, the beams are deflected and brought together by a segmented mirror 30 in order to reduce a distance between the beams, to thereby enable a larger number of beams to be projected through the same lens and to achieve resolution requirements to be discussed below.

Figure 4:
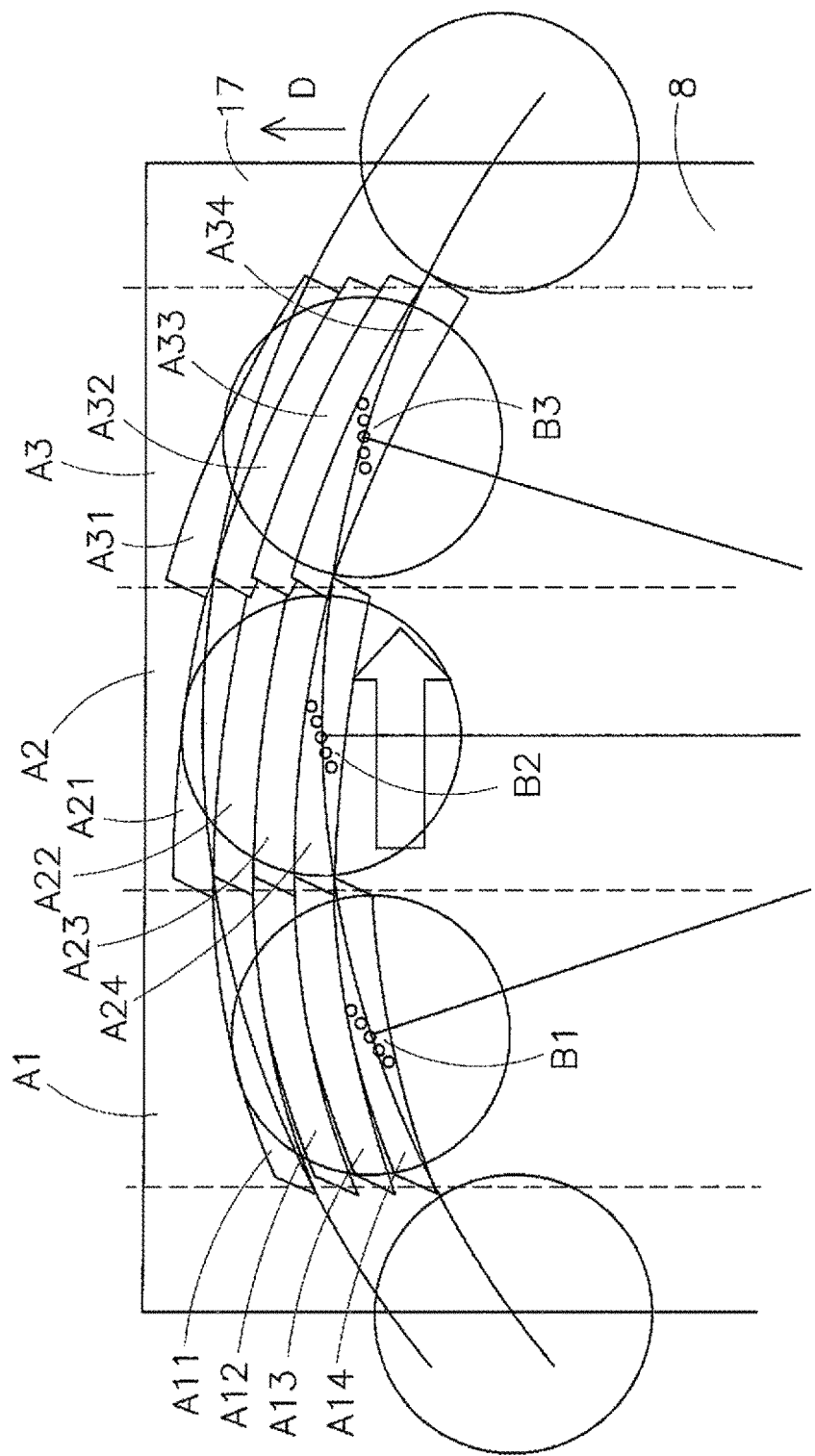
FIG. 4 depicts a schematic top view of projections by the lithographic apparatus according to FIG. 3 onto a substrate according to an embodiment of the invention.

As the rotatable frame rotates, the beams are incident on successive lenses and, each time a lens is irradiated by the beams, the places where the beams are incident on a surface of the lens, moves. Since the beams are projected on the substrate differently (with e.g. a different deflection) depending on the place of incidence of the beams on the lens, the beams (when reaching the substrate) will make a scanning movement with each passage of a following lens. This principle is further explained with reference to FIG. 4. FIG. 4 depicts a highly schematic top view of a part of the rotatable frame 8. A first set of beams is denoted by B1, a second set of beams is denoted by B2 and a third set of beams is denoted by B3. Each set of beams is projected through a respective lens set 14, 18 of the rotatable frame 8. As the rotatable frame 8 rotates, the beams B1 are projected onto the substrate 17 in a scanning movement, thereby scanning area A14. Similarly, beams B2 scan area A24 and beams B3 scan area A34. At the same time of the rotation of the rotatable frame 8 by a corresponding actuator, the substrate 17 and substrate table are moved in the direction D, which may be along the X axis as depicted in FIG. 2, thereby being substantially perpendicular to the scanning direction of the beams in the area's A14, A24, A34. As a result of the movement in direction D by a second actuator (e.g. a movement of the substrate table by a corresponding substrate table motor), successive scans of the beams when being projected by successive lenses of the rotatable frame 8, are projected so as to substantially abut each other, resulting in substantially abutting areas A11, A12, A13, A14 (areas A11, A12, A13 being previously scanned and A14 being currently scanned as shown in FIG. 4) for each successive scan of beams B1, resulting in areas A21, A22, A23 and A24 (areas A21, A22, A23 being previously scanned and A24 being currently scanned as shown in FIG. 4) for each successive scan of beams B2 and resulting in areas A31, A32, A33 and A34 (areas A31, A32, A33 being previously scanned and A34 being currently scanned as shown in FIG. 4) for each successive scan of beams B3. Thereby, the areas A1, A2 and A3 of the substrate surface may be covered with a movement of the substrate in the direction D while rotating the rotatable frame 8. The projecting of multiple beams through a same lens allows processing of a whole substrate in a shorter timeframe (at a same rotating speed of the rotatable frame 8), since for each passing of a lens, a plurality of beams scan the substrate with each lens, thereby allowing increased displacement in the direction D for successive scans. Viewed differently, for a given processing time, the rotating speed of the rotatable frame may be reduced when multiple beams are projected onto the substrate via a same lens, thereby possibly reducing effects such as deformation of the rotatable frame, wear, vibrations, turbulence, etc. due to high rotating speed. In an embodiment, the plurality of beams are arranged at an angle to the tangent of the rotation of the lenses 14, 18 as shown in FIG. 4. In an embodiment, the plurality of beams are arranged such that each beam overlaps or abuts a scanning path of an adjacent beam.

A further effect of the aspect that multiple beams are projected at a time by the same lens, may be found in relaxation of tolerances. Due to tolerances of the lenses (positioning, optical projection, etc), positions of successive areas A11, A12, A13, A14 (and/or of areas A21, A22, A23 and A24 and/or of areas A31, A32, A33 and A34) may show some degree of positioning inaccuracy in respect of each other. Therefore, some degree of overlap between successive areas A11, A12, A13, A14 may be required. In case of for example 10% of one beam as overlap, a processing speed would thereby be reduced by a same factor of 10% in case of a single beam at a time through a same lens. In a situation where there are 5 or more beams projected through a same lens at a time, the same overlap of 10% (similarly referring to one beam example above) would be provided for every 5 or more projected lines, hence reducing a total overlap by a factor of approximately 5 or more to 2% or less, thereby having a significantly lower effect on overall processing speed. Similarly, projecting at least 10 beams may reduce a total overlap by approximately a factor of 10. Thus, effects of tolerances on processing time of a substrate may be reduced by the feature that multiple beams are projected at a time by the same lens. In addition or alternatively, more overlap (hence a larger tolerance band) may be allowed, as the effects thereof on processing are low given that multiple beams are projected at a time by the same lens.

Alternatively or in addition to projecting multiple beams via a same lens at a time, interlacing techniques could be used, which however may require a comparably more stringent matching between the lenses. Thus, the at least two beams projected onto the substrate at a time via the same one of the lenses have a mutual spacing, and the lithographic apparatus may be arranged to operate the second actuator so as to move the substrate with respect to the optical column to have a following projection of the beam to be projected in the spacing.

In order to reduce a distance between successive beams in a group in the direction D shown in FIG. 4 (thereby e.g. achieving a higher resolution in the direction D), the beams may be arranged diagonally in respect of each other, in respect of the direction D. The spacing may be further reduced by providing a segmented mirror 30 in the optical path, each segment to reflect a respective one of the beams, the segments being arranged so as to reduce a spacing between the beams as reflected by the mirrors in respect of a spacing between the beams as incident on the mirrors. Such effect may also be achieved by a plurality of optical fibers, each of the beams being incident on a respective one of the fibers, the fibers being arranged so as to reduce along an optical path a spacing between the beams downstream of the optical fibers in respect of a spacing between the beams upstream of the optical fibers.

Further, such effect may be achieved using an integrated optical waveguide circuit having a plurality of inputs, each for receiving a respective one of the beams. The integrated optical waveguide circuit is arranged so as to reduce along an optical path a spacing between the beams downstream of the integrated optical waveguide circuit in respect of a spacing between the beams upstream of the integrated optical waveguide circuit.

A system may be provided for controlling the focus of an image projected onto a substrate. The arrangement may be provided to adjust the focus of the image projected by part or all of an optical column in an arrangement as discussed above.

In an embodiment of the present invention, each of the self-emissive contrast devices may be provided within a respective individually controllable radiation source unit. Each such individually controllable radiation source unit may comprise a radiation source that is configured to provide a portion of the patterned beam of radiation that is projected onto the substrate, as discussed above.

The lithographic apparatus may include a control system that monitors at least one parameter of performance of the individually controllable radiation source unit during use, as discussed further below. The control system may be configured such that, if a criterion is met based on the monitored parameter of performance of the individually controllable radiation source unit, then that unit is identified for replacement. In other words, the control system may monitor the performance of the individually controllable radiation source unit in order to predict a potential failure of the radiation source unit such that it can be replaced before failure.

This may be advantageous because it may help ensure that individually controllable radiation source units are replaced before failure, at least in a majority of instances. Replacing an individually controllable radiation source unit prior to failure may be beneficial because, if such a unit fails during the exposure of a pattern on a substrate, the pattern formed on the substrate may include one or more errors, which may result in the scrapping of, or requirement to re-work, the substrate or one of the devices being formed on the substrate or the malfunction of one or more of the devices.

Furthermore, monitoring the at least one parameter of performance of each of the individually controllable radiation source units enables the control system effectively to predict when a failure may occur. Therefore, if as a result of monitoring during a first time period, in which radiation is projected into the substrate, it is identified that an individually controllable radiation source unit should be replaced, the individually controllable radiation source unit may be replaced during a second time period, in which the lithographic apparatus is not, in any case, projecting a patterned beam of radiation onto the substrate. Accordingly, further downtime for the lithographic apparatus is not created. This may increase the throughput of the lithographic apparatus in comparison to an apparatus in which operation of the lithographic apparatus is suspended each time one of the individually controllable radiation source units ceases to operate.

According to an embodiment, the lithographic apparatus may include a replacement mechanism that is configured to remove an individually controllable radiation source unit and install in its place a replacement unit. In particular, the replacement mechanism may be configured to operate in response to an instruction from the control system to replace one of the individually controllable radiation source units in response to a criterion being met based on the monitored parameter of performance of the individually controllable radiation source unit. Accordingly, an automatic system is provided to identify one or more individually controllable radiation source units to be replaced and to implement the replacement of the identified unit.

In some arrangements, the individually controllable radiation source units may be replaced individually. In that case, the replacement mechanism may be used to replace a particular individually controllable radiation source unit when it is identified that particular individually controllable radiation source unit should be replaced.

In an arrangement, a plurality of individually controllable radiation source units may be installed within the lithographic apparatus as a combined unit. In such an arrangement, the replacement mechanism may be configured to replace such a combined unit when it is determined that any one of the individually controllable radiation source units within the combined unit should be replaced. Offline the combined unit that is replaced may be scrapped. Alternatively, the individually controllable radiation source unit that has been identified for replacement may be replaced and the combined unit may subsequently be made available for re-installation in the lithographic apparatus. In such an arrangement, one or more other individually controllable radiation source units may be replaced at the same time, for example, if it is determined that the usable lifetime is likely to be below a certain threshold. This determination may be made on the basis of the monitored parameter of performance discussed above or based on the time of operation of the individually controllable radiation source unit prior to the removal of the combined unit.

The provision of such an automatic replacement mechanism may significantly reduce the time required to replace an individually controllable radiation source unit in comparison to an operator doing so. For example, a robotic system may be provided within the lithographic apparatus, including at a location that is difficult for a human operator to access, and may be configured to quickly disconnect an individually controllable radiation source unit from the lithographic apparatus and insert in its place a replacement unit.

In order to facilitate such a replacement mechanism within a lithographic apparatus, the one or more individually controllable radiation source units and the one or more receiving locations within the lithographic apparatus to receive the individually controllable radiation source unit(s) may be appropriately configured.

For example, an appropriate clamping mechanism may be provided to the individually controllable radiation source unit, or to the receiving location, or to both, in order to secure physically the individually controllable radiation source unit to the lithographic apparatus during use. Such a clamping mechanism may comprise, for example, an actuatable physical clamp, an electromagnetic clamp, a vacuum clamp or any other suitable mechanism.

Furthermore, the individually controllable radiation source unit and the receiving location may be provided with a suitably configured electrical contact in order to provide electrical power to the individually controllable radiation source unit in order to operate the radiation source(s). Furthermore, one or more additional electrical contacts may be provided in order to provide control signals between the individually controllable radiation source unit and the remainder of the lithographic apparatus as required.

A lithographic apparatus may use more than one type of individually controllable radiation source unit. In such an arrangement, one kind of individually controllable radiation source unit may have a significantly shorter useable life than another. In that case, it may only be necessary to monitor and replace individually controllable radiation source units of one type.

Although the present description makes reference to the monitoring and replacement of individually controllable radiation source units that may, for example, comprise a radiation emitting diode as a radiation source, alternative arrangements of radiation sources may also be monitored and replaced by means of the embodiments described herein. In particular, therefore, an embodiment of the present invention is applicable to a lithographic apparatus having a plurality of radiation source units that are not necessarily individually controllable. For example, an array of radiation source units may be used in conjunction with separate modulators. Furthermore, alternative sources of radiation may be used, with appropriate modifications to the remainder of the lithographic apparatus. For example, the radiation source units may include an electron source or an ion source.

Figure 5:
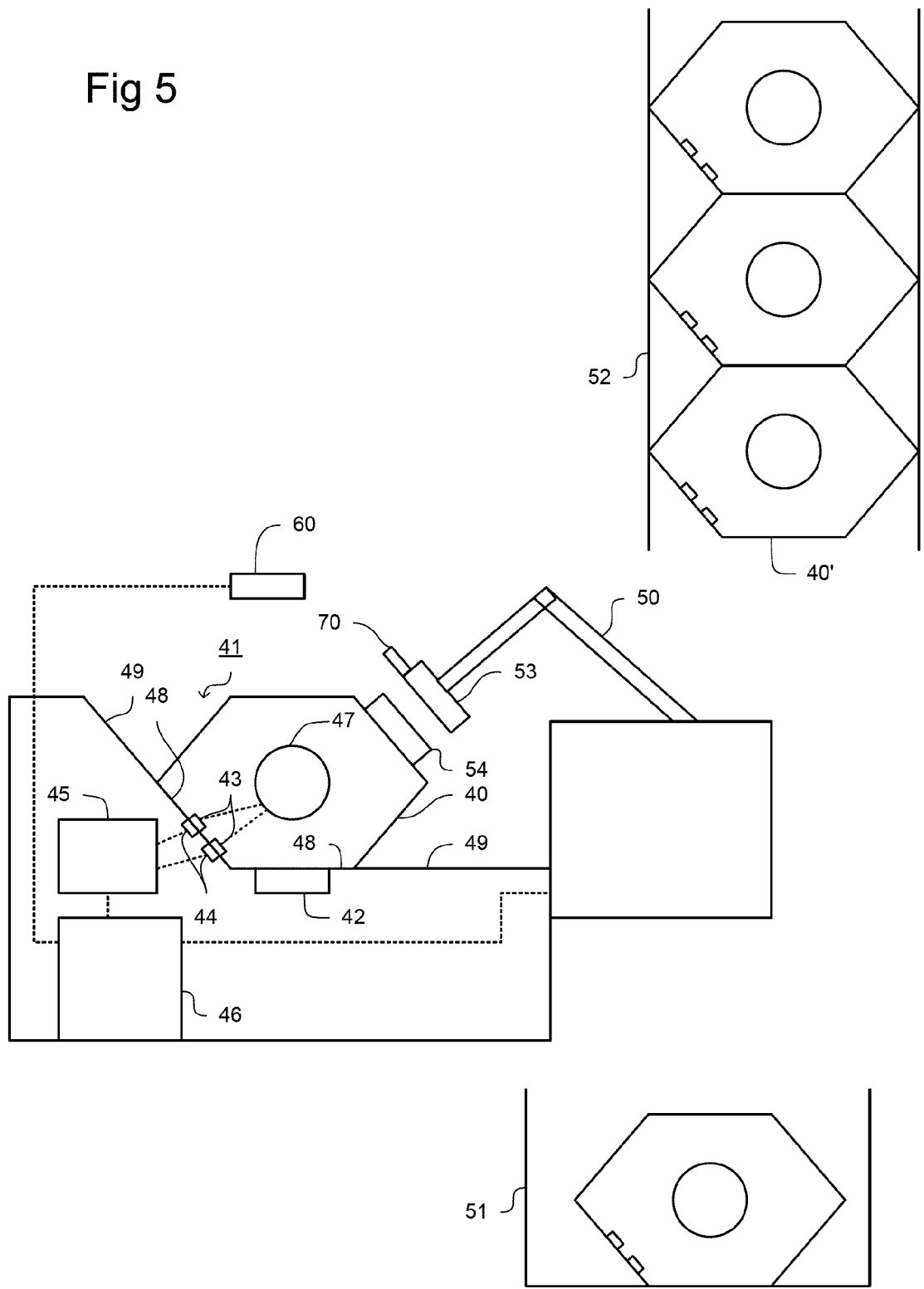
FIG. 5 schematically depicts a portion of a lithographic apparatus according to an embodiment of the present invention.

FIG. 5 schematically depicts an arrangement of a part of a lithographic apparatus according to an embodiment of the present invention. As shown, each individually controllable radiation source unit 40 may be installed in a receiving location 41 within the lithographic apparatus. As shown, the receiving location 41 may include a clamp 42 to secure an individually controllable radiation source unit 40 within the receiving location during use of the lithographic apparatus.

One or more electrodes 43 provided to the individually controllable radiation source unit 40 may be configured to meet one or more electrodes 44 provided to the receiving location 41, for example to provide power to a radiation source 47 within the individually controllable radiation source 40 from a power supply 45. The power supply 45 may be controlled by a control system 46 as discussed further below. Although not depicted in FIG. 5, one or more additional electrodes may be provided, if desired, to provide control signals between the control system 46 and the individually controllable radiation source unit 40.

A replacement mechanism 50 may be provided that is configured to operate, under the instruction of the control system 46, to remove the individually controllable radiation source unit 40 from the receiving location 41. For example, when such an individually controllable radiation source unit is removed, the replacement mechanism 50 may remove it to a disposal unit 51. Subsequently, the replacement mechanism may obtain a replacement individually controllable radiation source unit 40', for example from a magazine 52 containing a plurality of replacement individually controllable radiation source units and install the replacement individually controllable radiation source unit 40' to the receiving location 41, enabling the operation of the lithographic apparatus to resume or continue.

Although the above description refers to the removal of one individually controllable radiation source unit 40 before the removal of a replacement unit 40' from the magazine 52 and the installation of the replacement unit 40' in the receiving location 41, these steps need not be performed sequentially in this manner. For example, the replacement mechanism 50 may be configured to remove a new individually controllable radiation source unit 40' from the magazine 52 and this may be installed at the receiving location 41 at the same time as the existing individually controllable source unit 40 is removed. This may enable a faster replacement process.

As shown in FIG. 5, the replacement mechanism 50 and the individually controllable radiation source unit 40 may be provided with releasable connectors 53,54, respectively, to enable an individually controllable radiation source unit 40 to be temporarily connected to the replacement mechanism 50 for movement from the receiving location 41 to the disposal unit 51 and from the magazine 52 to the receiving location 41. Any suitable releasable connector may be used, for example, a physical clamp, an electromagnetic clamp or a vacuum clamp.

In an arrangement, the individually controllable radiation source units 40 may be interchangeable. For example, any one of the individually controllable radiation source units 40 provided within the magazine 52 may be used to replace any individually controllable radiation source unit 40 at any receiving location 41. Such an arrangement may reduce the requirement to store large numbers of replacement individually controllable radiation source units 40, for example of different types for different locations, within the magazine 52.

The provision of an automatic system to identify an individually controllable radiation source unit to be replaced and to replacing it, such as described above and depicted in FIG. 5, may significantly prevent or reduce the downtime caused by replacing a failed individually controllable radiation source unit. For example, the use of a replacement mechanism 50 such as described above may permit the replacement of an individually controllable radiation source unit 40 within a time span of the order 10 second, up to approximately 30 second. In such an arrangement, it may be possible to perform the replacement of any individually controllable radiation source unit to be replaced during the time period in which a new substrate is being loaded into the lithographic apparatus. In other words, one of the individually controllable radiation source units may be replaced during a time period in which no pattern beam of radiation is projected onto a substrate. Accordingly, the replacement of the individually controllable radiation source unit may be performed without creating additional downtime of the lithographic apparatus.

In such an arrangement, the number of individually controllable radiation source units that may be used can be increased (increasing the potential throughput of a lithographic apparatus) without increasing downtime of the lithographic apparatus caused by replacing a failed individually controllable radiation source unit. For example, a lithographic apparatus may include a relatively large number of individually controllable radiation source units and it is expected that relatively frequently one individually controllable radiation source unit may need to be replaced. Accordingly, when monitoring of a performance parameter indicates that an individually controllable radiation source unit may need to be replaced, this replacement may be scheduled for the next convenient opportunity, such as while a new substrate is loaded. This may enable the unit to be replaced before failure but without additional down time for the lithographic apparatus.

In an arrangement as discussed above, a single replacement mechanism 50 may be sufficient. In that case, the replacement mechanism 50 may be configured such that it can replace an individually controllable radiation source unit 40 at any of a plurality of receiving locations 41 within the lithographic apparatus.

In an alternative arrangement, more than one replacement mechanism 50 may be provided. In such an arrangement, each replacement mechanism 50 may be configured to be able to replace individually controllable radiation source units 40 from a respective receiving location 41 within the lithographic apparatus. Accordingly, the range of movement for each replacement mechanism 50 may be reduced.

As a further alternative, each of a plurality of replacement mechanisms 50 may be configured such that it can replace individually controllable radiation source units from any of the receiving locations 41. In that case, the provision of a plurality of replacement mechanisms 50 may enable more than one individually controllable radiation source unit 40 to be replaced simultaneously. This may be desirable if it is anticipated that more than one individually controllable radiation source unit 40 may be identified as requiring replacement at one time. Accordingly, replacing more than one individually controllable radiation source unit 40 simultaneously may help ensure that all necessary replacements are performed during the time available, for example, during the loading of a new substrate into the lithographic apparatus.

In an embodiment, the control system 46 may be configured to monitor the electrical current provided to the individually controllable radiation source unit 40 by the power supply 45. In particular, the control system 46 may be configured to monitor the electrical current supplied to the radiation source of the individually controllable radiation source unit 40 in order to provide an output beam of radiation of a specified intensity.

For example, a radiation intensity detector 60, such as a diode, may be provided in order to measure the intensity of the beam of radiation output by the individually controllable radiation source unit 40. In an embodiment, the individually controllable radiation source unit 40 may be controlled by the control system 46, using feedback from the radiation intensity sensor 60 such that, when a beam of radiation is output from the individually controllable radiation source unit 40, it has a substantially constant radiation intensity. In this case, a parameter of performance monitored by the control system 46 may be the electrical current necessary to provide the requisite intensity of the output beam of radiation.

The radiation intensity detector 60 may be provided at any appropriate location within the system. In one example, the radiation intensity detector 60 may be located at the substrate support and configured such that it can monitor the output for more than one of the radiation source units. In an additional or alternative arrangement, the radiation intensity detector 60 may be located within an optical column and configured such that it can monitor the output of all of the individually controllable radiation source units within the optical column. In a lithographic apparatus having a plurality of separate optical columns, a radiation intensity detector 60 may be provided for each optical column.

In general, it is expected that the electrical current required to be provided to the radiation source 47 within the individually controllable radiation source unit 40 will increase over time until the radiation source 47 fails. Therefore, the control system 46 may be configured to identify that an individually controllable radiation source unit 40 requires replacement once the electrical current provided to it in order to provide a certain intensity of the output beam of radiation exceeds a given threshold.

In an embodiment, the threshold may be set for all of the individually controllable radiation source units 40 within the lithographic apparatus. For example, the threshold may be set at a given proportion of the electrical current expected to be required to provide a certain intensity of the output beam of radiation when an individually controllable radiation source unit 40 is first installed. For example, this may correspond to the average electrical current required when an individually controllable radiation source unit 40 is first installed.

In an example, the threshold may be set at 130% of the expected initial electrical current required. This threshold may therefore be predetermined before the individually controllable radiation source unit 40 is installed. Accordingly, whenever the electrical current required for any individually controllable radiation source unit 40 to provide the required intensity of the output beam of radiation, exceeds the threshold, that individually controllable radiation source unit 40 may be identified for replacement.

In an alternative arrangement, the control system 46 may identify the electrical current required for each individually controllable radiation source unit 40 when it is first installed in the lithographic apparatus and a respective threshold may be retained for each individually controllable radiation source unit 40 based on the initial current value required for each individually controllable radiation source unit 40.

For example, the control system 46 may include a memory configured to store the initial current required for each individually controllable radiation source unit when it is first installed in order to provide the desired radiation intensity in the output beam of radiation and/or the threshold electrical current for each individually controllable radiation source unit 40 at which it should be replaced.

Alternatively or additionally, a parameter of performance of each of the individually controllable radiation source units 40 monitored by the control system 46 may be the ratio of the electrical current provided to the radiation source 47 within each individually controllable radiation source unit 40 to the resulting radiation intensity of the output beam of radiation. This may be a more useful parameter of performance if a lithographic apparatus is configured to provide varying intensity beams of radiation from each of the individually controllable radiation source units 40.

The relationship between the electrical current provided to the radiation source 47 and the output radiation intensity may be non-linear. Accordingly, the ratio may be monitored at a particular level of electrical current provided to the radiation source 47, at a particular radiation intensity level or over a range of either of these.

The threshold of the ratio at which the control system 46 may identify that an individually controllable radiation source unit 40 should be replaced may be common for all individually controllable radiation source units 40 within the lithographic apparatus, for example set at a fixed percentage of the expected ratio when an individually controllable radiation source unit 40 is first installed into the lithographic apparatus. Alternatively, a threshold may be stored for each individually controllable radiation source unit 40, based on the initial value of the ratio when the individually controllable radiation source 40 is first installed in the lithographic apparatus.

Figure 6:
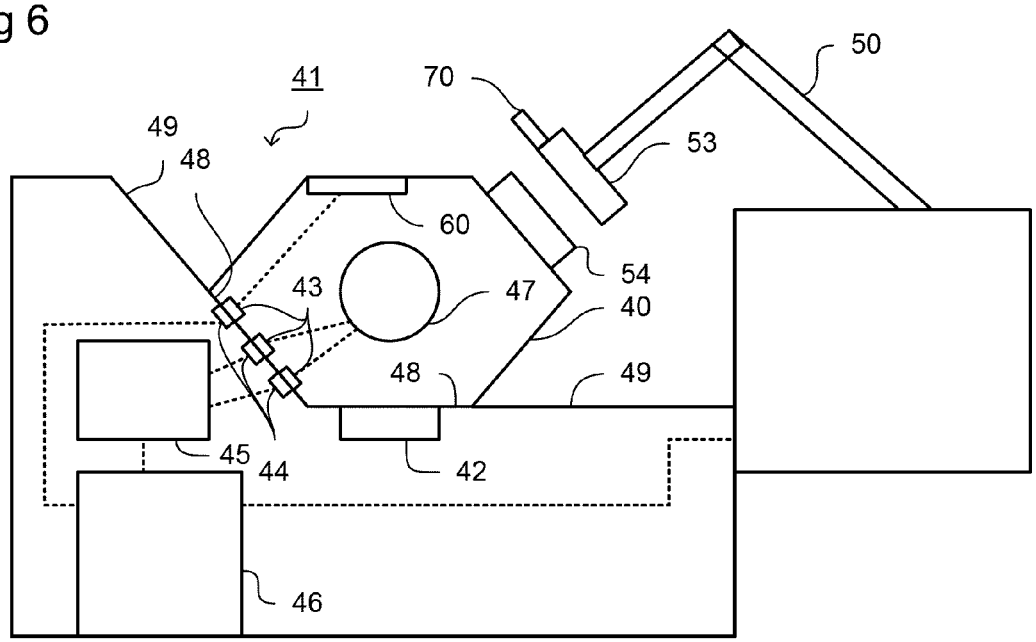
FIG. 6 depicts a variation of the arrangement depicted in FIG. 5.

FIG. 6 depicts a variant of the arrangement depicted in FIG. 5. As shown, in this embodiment, the radiation intensity sensor 60 is mounted within or on the individually controllable radiation source unit 40, which may simplify the arrangement to determine the intensity of the beam of radiation provided by the radiation source 47 of each of the individually controllable radiation source units 40.

Figure 7:
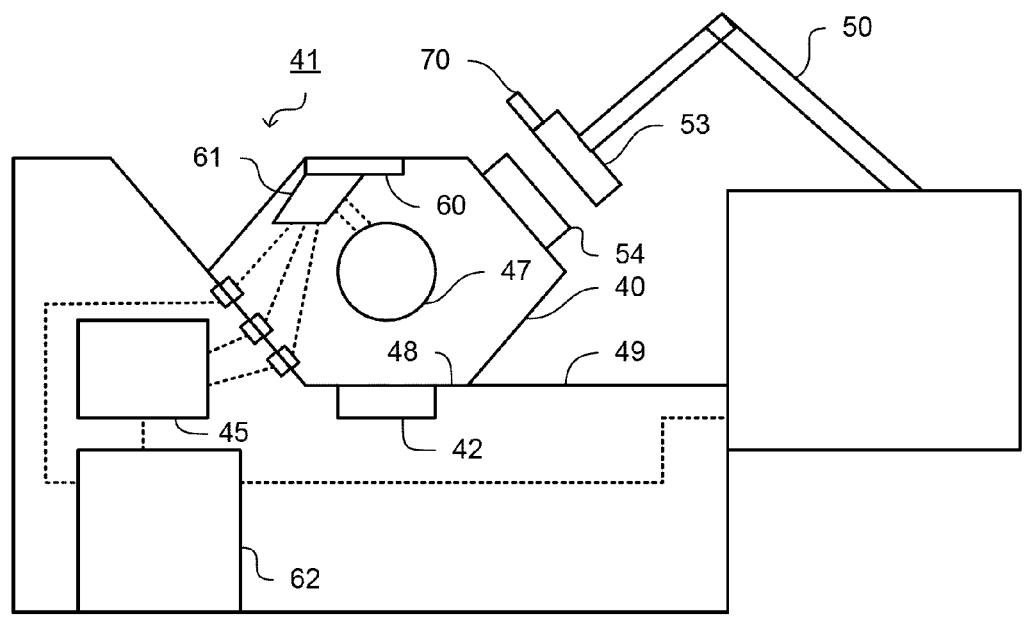
FIG. 7 depicts a further variation of the arrangement depicted in FIG. 5.

FIG. 7 depicts a further variation of the arrangement depicted in FIGS. 5 and 6. As shown, in this embodiment, the radiation intensity sensor 60 is, as with the arrangement depicted in FIG. 6, installed within or on the individually controllable radiation source unit 40. However, instead of or in addition to providing the measured intensity to an external control system 46, in this embodiment, the individually controllable radiation source unit 40 includes a control unit 61 that controls the electrical current provided to the radiation source 47 in response to the measured radiation intensity detected by the radiation intensity sensor 60. Accordingly, for example, the control unit 61 may be configured to provide a feedback mechanism to help ensure that the electrical current provided to the radiation source 47 is such that a substantially constant radiation intensity is provided in the beam of radiation output by the individually controllable radiation source unit 40 when in use.

As shown in FIG. 7, the control unit 61 may be configured to provide a control signal to a central controller 62 of the lithographic apparatus. In one arrangement, the control signal provided to the central controller 62 may correspond to the electrical current being provided to the radiation source 47. Accordingly, the central controller 62 may monitor the electrical current as discussed above in order to determine when the individually controllable radiation source unit should be replaced.

Alternatively or additionally, the control unit 61 within the individually controllable radiation source unit 40 may monitor the electrical current provided to the radiation source 47 and may identify when an individually controllable radiation source unit 40 should be replaced, as above based on either a threshold set for the entire lithographic apparatus or an individual threshold set for the individually controllable radiation source unit, for example based on the electrical current required when the unit is first installed. In this case, the control signal provided from the control unit 61 to the central controller 62 may simply be a flag to identify that the individually controllable radiation source unit 40 should be replaced.

Accordingly, the central controller 62 may then instruct the replacement mechanism 50 accordingly to replace the individually controllable radiation source unit 40. Such an arrangement may beneficially involve simpler communication between the individually controllable radiation source unit 40 and the central controller 62. However, the individually controllable radiation source unit 40 of such an arrangement may have greater complexity and may therefore be more expensive.

In such an arrangement, the control system would be a distributed control system comprised of the combination of the control unit 61 in each of the individually controllable radiation source units 40 and the central controller 62.

The replacement mechanism 50, the individually controllable radiation source units 40 and the receiving locations 41 may be configured such that the individually controllable radiation source units 40 can be installed within the lithographic apparatus to a certain desired accuracy. In particular, it may be desirable to ensure that the position of an output beam of radiation provided by the individually controllable radiation source units 40 is positioned to within an accuracy of approximately 1 µm relative to the remainder of the lithographic apparatus. Control of the accuracy of radiation beam pointing may also be required. For example the angle of radiation beam pointing may be controlled to within an accuracy of approximately 1 mrad.

In an embodiment, the individually controllable radiation source units 40 may be provided with one or more external reference surfaces 48. These may be configured to cooperate with corresponding reference surfaces 49 at each of the receiving locations 41 of the lithographic apparatus. Accordingly, for example, the reference surfaces 48,49 may cooperate, namely meet, so as to precisely define the position and orientation of the external surface of the individually controllable source unit 40 when it is installed in a receiving location 41 to within the desired accuracy.

Although the arrangement schematically depicted in FIG. 5 includes two reference surfaces 49 at each of the receiving locations, cooperating with a corresponding pair of external reference surfaces 48 on the individually controllable radiation source unit 40, alternative arrangements may be used. In particular, one or more additional sets of corresponding reference surfaces 48, 49 may be provided in order to define the position and orientation of the external surface of an individually controllable source unit when it is installed in a receiving location 41. For example, in the arrangement schematically depicted in FIG. 5, an additional reference surface 49 may be provided to the receiving location 41 arranged parallel to the plane of the Figure, and arranged to cooperate with a corresponding external reference surface 48 provided on the individually controllable radiation source unit 40 in order to define the position of the individually controllable radiation source unit 40 relative to the receiving location 41 in a direction perpendicular and/or parallel to the plane of the Figure.

In such an arrangement, each of the individually controllable radiation source units 40 may be configured such that the position and/or orientation of the output beam of radiation relative to the one or more external reference surfaces 48 of the individually controllable radiation source unit 40 is within a required tolerance. As a consequence, when the individually controllable radiation source unit 40 is installed at a receiving location 41, the position of the output beam of radiation relative to the reference surface 49 of the receiving location 41, and therefore to the remainder of the lithographic apparatus may be within the desired accuracy range.

In order to help ensure that the position and/or orientation of the output beam of radiation of an individually controllable radiation source 40 relative to its one or more external reference surfaces 48 is within a required tolerance, the individually controllable radiation source unit 40 may be inspected prior to use, namely before being provided to the magazine 52 of the lithographic apparatus. Furthermore, the individually controllable radiation source unit 40 may be provided with an adjustment mechanism, for example one or more moveable optical elements that may enable adjustment of the position and/or orientation of the beam of radiation output by the individually controllable radiation source unit based on the inspection in order to help ensure that it is within the required tolerance when measured relative to the one or more external reference surfaces 48.

Alternatively or additionally, the replacement mechanism 50 may be provided with a sensor 70 to measure the position and/or orientation of a beam of radiation output from an individually controllable radiation source unit 40. For example, the sensor 70 may measure the position relative to a fixed point within the lithographic apparatus. Accordingly, during the process of installing an individually controllable radiation source unit 40 to a receiving location 41 within the lithographic apparatus, the replacement mechanism 50 may measure the position and/or orientation of a beam of radiation output from the unit being installed.

The replacement mechanism 50 may be configured subsequently to adjust the position and/or orientation of the entire individually controllable radiation source unit until the position and/or orientation of the output beam of radiation is within a required tolerance before the position of the individually controllable radiation source unit 40 is fixed relative to the receiving location 41. Compared to the arrangement discussed above, such an arrangement may have reduced costs of installing the individually controllable radiation source unit 40. However, the cost and complexity of the replacement mechanism 50 may be higher.

By means of the above described system, a lithographic apparatus may be maintained. In particular, where necessary, individually controllable radiation source units 40 may be replaced. In particular, the system may enable the identification of an individually controllable radiation source unit 40 that should be replaced prior to its failure, while also helping to ensure that the radiation source unit 40 may be replaced at a suitable opportunity, for example during other down time of the lithographic apparatus or a period when a patterned beam of radiation is not being projected onto substrates, such as during the loading of a new substrate. Accordingly, the lithographic apparatus may be maintained at the same time as being used to project patterned beams of radiation onto substrates in order to form devices on the substrate.

In accordance with a device manufacturing method, a device, such as a display, integrated circuit or any other item may be manufactured from the substrate on which the pattern has been projected.

Further embodiments according to the invention are provided in below numbered clauses:

1. A lithographic apparatus, configured to project a patterned beam of radiation onto a substrate comprising:
   a plurality of radiation source units, each comprising a radiation source configured to provide a portion of the patterned beam of radiation;
   a control system, configured to monitor at least one parameter of the performance of the radiation source units; and
   a replacement mechanism, configured to be operated in response to an instruction from the control system to replace at least one of the radiation source units with a replacement unit;
   wherein the control system is configured to control the replacement mechanism to replace at least one radiation source unit if a criterion is met based on the monitored parameter of performance of one of the radiation source units.
2. The lithographic apparatus according to clause 1, wherein the control system is configured to control the replacement mechanism to replace only the radiation source unit for which the criterion is met based on the monitored parameter of performance.
3. The lithographic apparatus according to clause 1, wherein the control system is configured to control the replacement mechanism to replace a plurality of radiation source units including the radiation source unit for which the criterion is met based on the monitored parameter of performance.
4. The lithographic apparatus according to any of clauses 1-3, wherein a threshold value is set for at least one monitored parameter of performance; and when the monitored parameter of performance of a radiation source unit passes the threshold value, the control system determines that the radiation source unit should be replaced.
5. The lithographic apparatus according to clause 4, wherein a single threshold value for the at least one parameter of performance is set for all radiation source units in the lithographic apparatus.
6. The lithographic apparatus according to clause 4, wherein a threshold value for the at least one parameter of performance is set for each radiation source unit.
7. The lithographic apparatus according to clause 6, wherein the threshold value for the at least one parameter of performance for each radiation source unit is set as a certain proportion of an initial value of the parameter of performance determined when the radiation source unit is first installed.
8. The lithographic apparatus according to any of the preceding clauses, configured such that, in operation, there is a first time period when radiation is projected onto a substrate and a second time period when radiation is not projected onto a substrate; and
   the control system is configured such that, when the control system determines based on monitoring during the first time period that at least one of the radiation source units should be replaced, it controls the replacement mechanism to replace the at least one radiation source unit in a subsequent second time period.
9. The lithographic apparatus according to any of the preceding clauses, wherein the at least one parameter monitored by the control system comprises an electrical current level required to be provided to the radiation source of each radiation source unit for the radiation source to output radiation of a given intensity.
10. The lithographic apparatus according to any of the preceding clauses, wherein the at least one parameter monitored by the control system comprises a ratio of electrical current supplied to the radiation source of each radiation source unit to intensity of the radiation output by the radiation source.
11. The lithographic apparatus according to clause 9 or clause 10, wherein the control system comprises an electrical current sensor, external to the radiation source unit, configured to measure the electrical current provided to the radiation source unit.
12. The lithographic apparatus according to any of clauses 9-11, wherein the control system comprises a radiation intensity sensor, external to the radiation source unit, configured to measure the intensity of radiation output by the radiation source unit.

13. The lithographic apparatus according to any of clauses 9-11, wherein each of the radiation source units comprises a radiation intensity sensor, configured to measure the intensity of radiation output by the radiation source and to provide a control signal to the control system that represents the measured radiation intensity.

14. The lithographic apparatus according to clause 9 or clause 10, wherein each of the radiation source units comprises:
   a sensor to measure the electrical current provided to the radiation source and to measure the intensity of radiation output by the radiation source; and
   a control unit, configured to determine from the measurement of the sensor if the criterion has been met for the replacement of the radiation source unit,
   wherein the control system of the lithographic apparatus comprises each of the control units of the radiation source units and a central controller,
   the control units of the radiation source units are configured to send a control signal to the central controller when the respective control unit determines that the criterion has been met for the replacement of the radiation source unit, and
   the central controller is configured to control the replacement mechanism to replace a radiation source unit based on the control signal from the control unit of the radiation source unit.

15. The lithographic apparatus according to any of the preceding clauses, wherein each of the radiation source units is an individually controllable radiation source unit.

16. The lithographic apparatus according any of the preceding clauses, wherein the replacement mechanism is configured such that it can replace any of the radiation source units.

17. The lithographic apparatus according to any of the preceding clauses, comprising a plurality of replacement mechanisms, each configured to be operated under control of the control system to replace one of a respective plurality of the radiation source units with a replacement unit,
   wherein the lithographic apparatus is configured such that each of the radiation source units can be replaced by at least one of the replacement mechanisms.

18. The lithographic apparatus according to clause 17, wherein the lithographic apparatus may be configured such that at least one of the radiation source units may be replaced by one of the plurality of the replacement mechanisms.

19. The lithographic apparatus according to any of the preceding clauses, further comprising a magazine, configured to store a plurality of replacement radiation source units,
   wherein the replacement mechanism is configured to remove a radiation source unit from the magazine and use it to replace a radiation source unit that has been in use in the lithographic apparatus.

20. The lithographic apparatus according to clause 19, wherein the lithographic apparatus is configured such that any one of the radiation source units within the magazine may be used to replace any one of the radiation source units used within the lithographic apparatus.

21. The lithographic apparatus according to any of the preceding clauses, further comprising a disposal unit, configured to receive a radiation source unit that has been replaced,
   wherein the replacement mechanism is configured to place a radiation source unit that has been replaced in the disposal unit.

22. The lithographic apparatus according to any of the preceding clauses, wherein each of the radiation source units comprises at least one external reference surface;
   the lithographic apparatus comprises a plurality of receiving locations configured to receive a respective one of the radiation source units; and
   each of the receiving locations comprises at least one reference surface, complementary to the at least one reference surface of the radiation source unit, and configured such that, when a radiation source unit is fixed in a receiving location, the reference surfaces meet such that the position and/or orientation of the radiation source unit relative to the receiving location corresponds a certain desired position and/or orientation.

23. The lithographic apparatus according to clause 22, wherein each of the radiation source units is formed such that the position and/or orientation of a radiation source within the unit is predetermined relative to the at least one external reference surface of the radiation source unit to within a predetermined accuracy range, optionally such that any position error is less than 1 μm and/or any radiation beam pointing error is less than 1 mrad.

24. The lithographic apparatus according to clause 22 or clause 23, wherein the replacement mechanism is configured to locate a replacement radiation source unit in a receiving location such that the reference surfaces of the receiving location and the radiation source unit meet.

25. The lithographic apparatus according to any of clauses 1-21, comprising a plurality of receiving locations, configured to receive a respective one of the radiation source units,
   wherein the replacement mechanism comprises a sensor to determine the position and/or orientation of a beam of radiation output from a radiation source unit; and configured such that, when placing a replacement radiation source unit in a receiving location, the replacement mechanism uses information from the sensor to position the radiation source unit such that the position and/or orientation of the beam of radiation relative to the receiving location corresponds to a predetermined position and/or orientation to within a predetermined accuracy range, optionally such that any position error is less than 1 μm and/or any radiation beam pointing error is less than 1 mrad.

26. A method for maintaining a lithographic apparatus that comprises a plurality of radiation source units, each comprising a radiation source configured to provide a portion of a patterned beam of radiation to be projected onto a substrate, the method comprising:
   monitoring at least one parameter of the performance of the radiation source units; and
   replacing at least one of the radiation source units with a replacement unit based on the results of the monitoring using a replacement mechanism,
   wherein the replacement mechanism is operated to replace a radiation source unit if a criterion is met based on the monitored parameter of performance of one of the radiation source units.

27. A device manufacturing method, comprising:
 using a lithographic apparatus to project a patterned beam of radiation onto successive substrates; and
 using the method of clause 26 to maintain the lithographic apparatus during the use of the lithographic apparatus.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "lens", where the context allows, may refer to any one of various types of optical components, including refractive, diffractive, reflective, magnetic, electromagnetic and electrostatic optical components or combinations thereof.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus, configured to project a patterned beam of radiation onto a substrate comprising:
 a plurality of radiation source units, each comprising a radiation source configured to provide a portion of the patterned beam of radiation and configured such that at least one radiation source unit of the plurality of radiation source units installed in the lithographic apparatus is separately removable from another radiation source unit of the plurality of radiation source units installed in the lithographic apparatus;
 a control system, configured to monitor a parameter of the performance of the radiation source units; and
 a mechanical replacement mechanism having an actuating structure, configured to be operated in response to an instruction from the control system to replace the at least one radiation source unit with a replacement unit;
 wherein the control system is configured to control the replacement mechanism to replace at least one radiation source unit if a criterion is met based on the monitored parameter of performance of one of the radiation source units.

2. The lithographic apparatus according to claim 1, wherein the control system is configured to control the replacement mechanism to replace a plurality of radiation source units including the radiation source unit for which the criterion is met based on the monitored parameter of performance.

3. The lithographic apparatus according to claim 1, wherein a threshold value is set for a monitored parameter of performance; and responsive to the monitored parameter of performance of a radiation source unit passing the threshold value, the control system determines that the radiation source unit should be replaced.

4. The lithographic apparatus according to claim 3, wherein a threshold value for the parameter of performance is set for each radiation source unit.

5. The lithographic apparatus according to claim 4, wherein the threshold value for the parameter of performance for each radiation source unit is set as a certain proportion of an initial value of the parameter of performance determined when the radiation source unit is first installed.

6. The lithographic apparatus according to claim 1, configured such that, in operation, there is a first time period when radiation is projected onto a substrate and a second time period when radiation is not projected onto a substrate; and
 the control system is configured such that, responsive to the control system determining based on monitoring during the first time period that at least one of the radiation source units should be replaced, it controls the replacement mechanism to replace the at least one radiation source unit in a subsequent second time period.

7. The lithographic apparatus according to claim 1, wherein the parameter monitored by the control system comprises a ratio of electrical current supplied to the radiation source of each radiation source unit to intensity of the radiation output by the radiation source.

8. The lithographic apparatus according to claim 7, wherein each of the radiation source units comprises:
 a sensor to measure the electrical current provided to the radiation source and to measure the intensity of radiation output by the radiation source; and
 a control unit, configured to determine from the measurement of the sensor if the criterion has been met for the replacement of the radiation source unit,
 wherein the control system of the lithographic apparatus comprises each of the control units of the radiation source units and a central controller,
 the control units of the radiation source units are configured to send a control signal to the central controller responsive to the respective control unit determining that the criterion has been met for the replacement of the radiation source unit, and
 the central controller is configured to control the replacement mechanism to replace a radiation source unit based on the control signal from the control unit of the radiation source unit.

9. The lithographic apparatus according to claim 1, wherein each of the radiation source units is an individually controllable radiation source unit.

10. The lithographic apparatus according to claim 1, wherein the replacement mechanism is configured such that it can replace any of the radiation source units.

11. The lithographic apparatus according to claim 1, comprising a plurality of replacement mechanisms, each configured to be operated under control of the control system to replace one of a respective plurality of the radiation source units with a replacement unit,
wherein the lithographic apparatus is configured such that each of the radiation source units can be replaced by at least one of the replacement mechanisms.

12. The lithographic apparatus according to claim 1, further comprising a magazine, configured to store a plurality of replacement radiation source units,
wherein the replacement mechanism is configured to remove a radiation source unit from the magazine and use it to replace a radiation source unit that has been in use in the lithographic apparatus.

13. The lithographic apparatus according to claim 1, further comprising a disposal unit, configured to receive a radiation source unit that has been replaced,
wherein the replacement mechanism is configured to place a radiation source unit that has been replaced in the disposal unit.

14. The lithographic apparatus according to claim 1, wherein each of the radiation source units comprises an external reference surface;
the lithographic apparatus comprises a plurality of receiving locations configured to receive a respective one of the radiation source units; and
each of the receiving locations comprises an reference surface, complementary to the reference surface of the radiation source unit, and configured such that, when a radiation source unit is fixed in a receiving location, the reference surfaces meet such that the position and/or orientation of the radiation source unit relative to the receiving location corresponds to a certain desired position and/or orientation.

15. The lithographic apparatus according to claim 14, wherein each of the radiation source units is formed such that the position and/or orientation of a radiation source within the unit is predetermined relative to the external reference surface of the radiation source unit to within an accuracy range such that any position error is less than 1 µm and/or any radiation beam pointing error is less than 1 mrad.

16. The lithographic apparatus according to claim 14, wherein the replacement mechanism is configured to locate a replacement radiation source unit in a receiving location such that the reference surfaces of the receiving location and the radiation source unit meet.

17. A lithographic apparatus, configured to project a patterned beam of radiation onto a substrate comprising:
a plurality of radiation source units, each comprising a radiation source configured to provide a portion of the patterned beam of radiation;
a control system, configured to monitor a parameter of the performance of the radiation source units; and
a replacement mechanism, configured to be operated in response to an instruction from the control system to replace at least one of the radiation source units with a replacement unit;
wherein the control system is configured to control the replacement mechanism to replace at least one radiation source unit if a criterion is met based on the monitored parameter of performance of one of the radiation source units, and
wherein the replacement mechanism comprises a sensor to determine the position and/or orientation of a beam of radiation output from a radiation source unit;
and configured such that, when placing a replacement radiation source unit in a receiving location, the replacement mechanism uses information from the sensor to position the radiation source unit such that the position and/or orientation of the beam of radiation relative to the receiving location corresponds to a predetermined position and/or orientation to within an accuracy range.

18. A method for maintaining a lithographic apparatus that comprises a plurality of radiation source units, each comprising a radiation source configured to provide a portion of a patterned beam of radiation to be projected onto a substrate and configured such that at least one radiation source unit of the plurality of radiation source units installed in the lithographic apparatus is separately removable from another radiation source unit of the plurality of radiation source units installed in the lithographic apparatus, the method comprising:
monitoring a parameter of the performance of the radiation source units; and
replacing the at least one radiation source unit with a replacement unit based on the results of the monitoring using an actuating structure of a replacement mechanism within the lithographic apparatus,
wherein the replacement mechanism is operated to replace a radiation source unit if a criterion is met based on the monitored parameter of performance of one of the radiation source units.

19. A device manufacturing method, comprising:
using a lithographic apparatus to project a patterned beam of radiation onto successive substrates; and
using the method of claim 18 to maintain the lithographic apparatus during the use of the lithographic apparatus.

20. The method of claim 18, further comprising determining the position and/or orientation of a beam of radiation output from a radiation source unit using a sensor, and using, when placing a replacement radiation source unit in a receiving location, the information from the sensor to position the radiation source unit such that the position and/or orientation of the beam of radiation relative to the receiving location corresponds to a predetermined position and/or orientation to within an accuracy range.

* * * * *